United States Patent [19]

Gibson et al.

[11] Patent Number: 4,971,144
[45] Date of Patent: Nov. 20, 1990

[54] LIQUID RIBBON COOLER

[75] Inventors: David A. Gibson; Colin A. MacKay; Bill Weigler; Billy M. Hargis, all of Austin; Robert T. Smith, Round Rock, all of Tex.

[73] Assignee: Microelectronics and Computer Technology Corporation, Austin, Tex.

[21] Appl. No.: 358,031

[22] Filed: May 30, 1989

[51] Int. Cl.$^5$ ................................. F28F 3/12
[52] U.S. Cl. .................. 165/170; 165/80.4; 165/185; 361/385
[58] Field of Search .......... 165/80.4, 170, 46, 166, 165/185; 126/445, 448; 361/385

[56] References Cited

U.S. PATENT DOCUMENTS

| | | | |
|---|---|---|---|
| 1,437,339 | 11/1922 | Couche et al. | 165/170 |
| 3,269,459 | 8/1966 | Popovitch | 165/170 X |
| 3,428,141 | 2/1969 | Forstner et al. | 180/54 |
| 3,739,843 | 6/1973 | Haberski | 165/170 |
| 4,008,708 | 2/1977 | Hagarty | 126/445 |
| 4,213,498 | 7/1980 | Vandenbossche | 165/136 |
| 4,777,560 | 10/1988 | Herrell et al. | 361/384 |

FOREIGN PATENT DOCUMENTS

| | | | |
|---|---|---|---|
| 1127924 | 4/1962 | Fed. Rep. of Germany | 165/170 |
| 62-56789 | 3/1987 | Japan | 165/166 |

OTHER PUBLICATIONS

*IBM Tech. Disclosure Bulletin*, vol. 22, No. 8A, Jan. 1980, Thermally Enhanced Cold Plate, Nutter et al.

Primary Examiner—Martin P. Schwadron
Assistant Examiner—Allen J. Flanigan
Attorney, Agent, or Firm—Fulbright & Jaworski

[57] ABSTRACT

A flexible liquid ribbon cooler for use with electronic components which includes a plurality of elongate thermo-conductive members, which are circular in cross-section, and which are positioned side by side. A bottom and a top layer of thermo-conductive material enclose the bottom and tops of the elongate members and form a plurality of liquid coolant passageways between the elongate members within the layers. The elongate members may be solid cylinders or tubes. A plurality of microcapillaries may be formed in the bottom layer to provide additional thermocoupling, adhesion, and detachability.

9 Claims, 4 Drawing Sheets

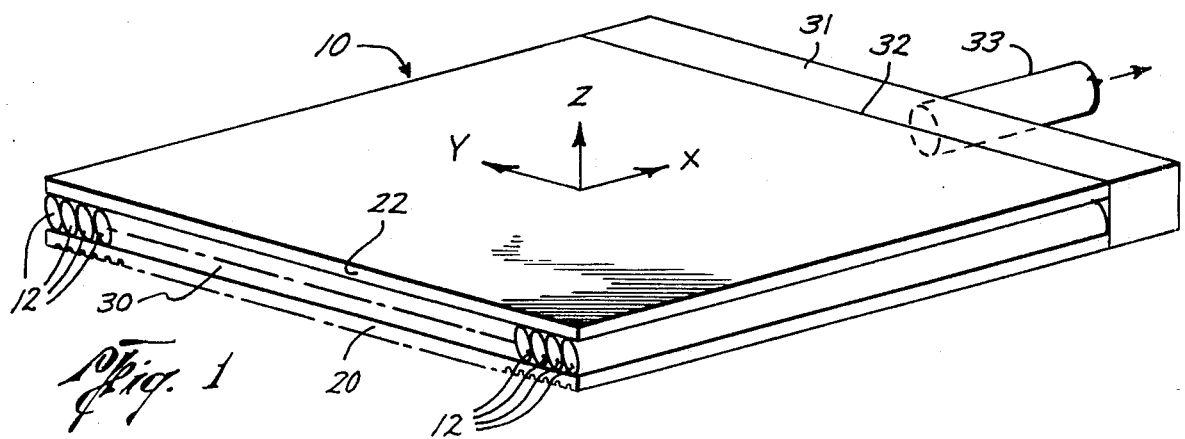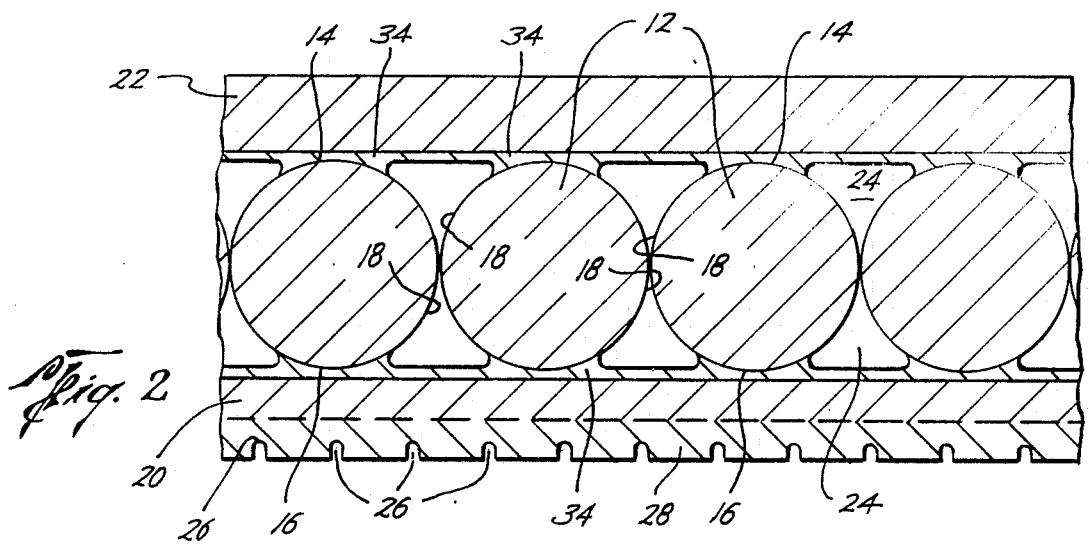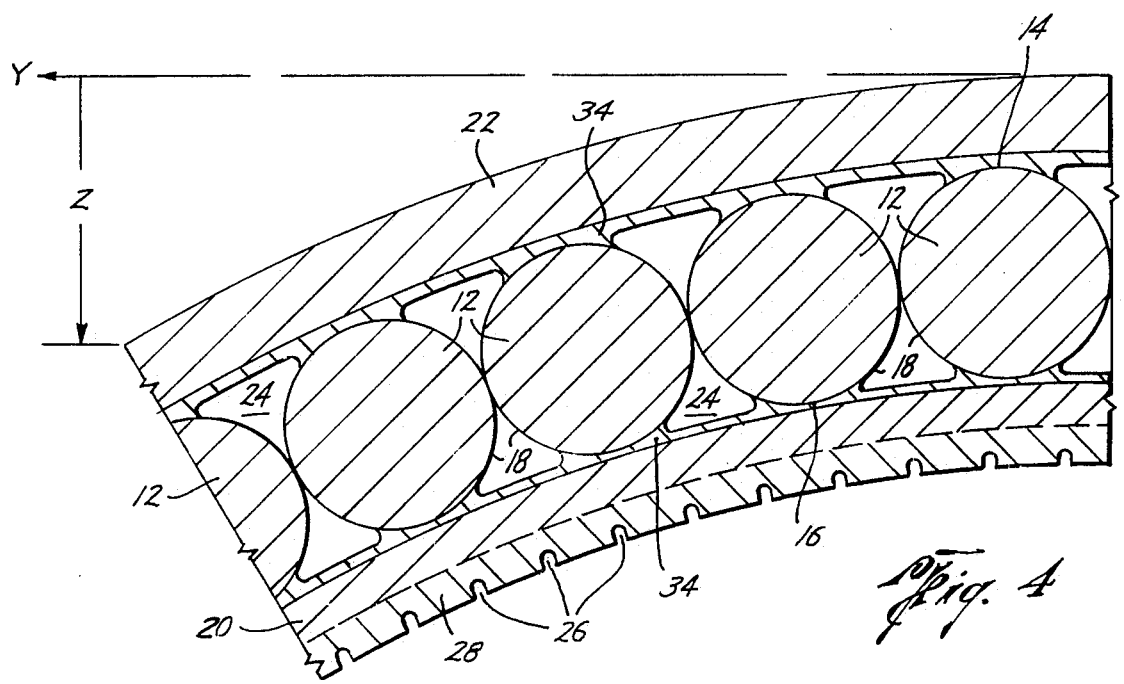

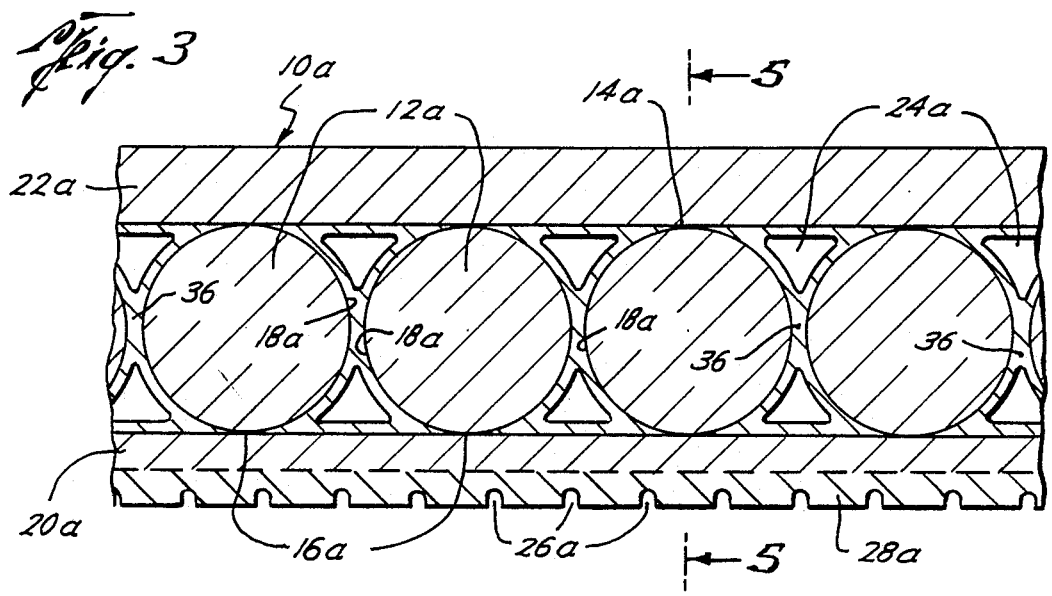
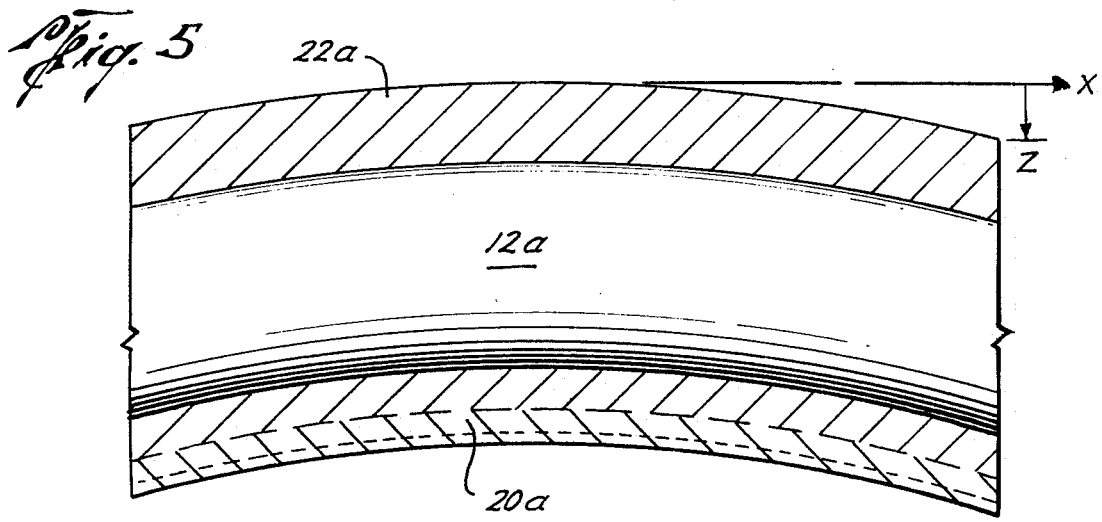
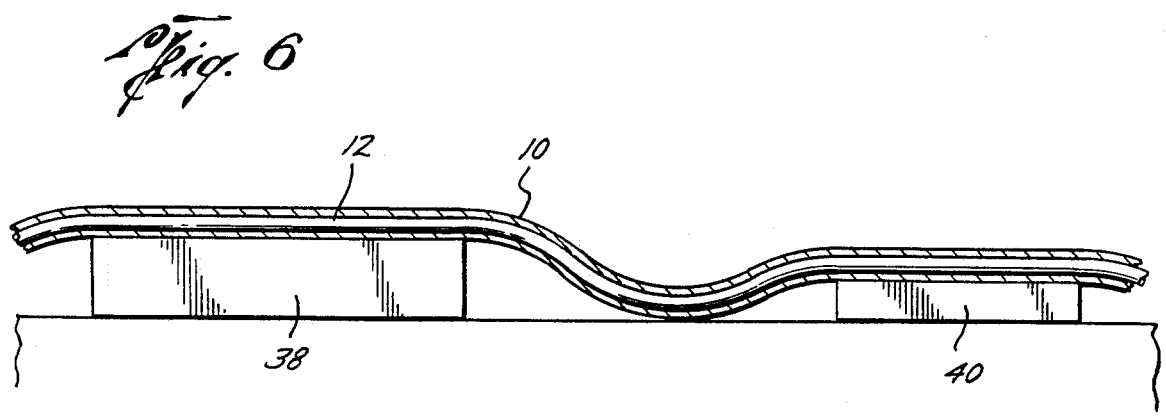

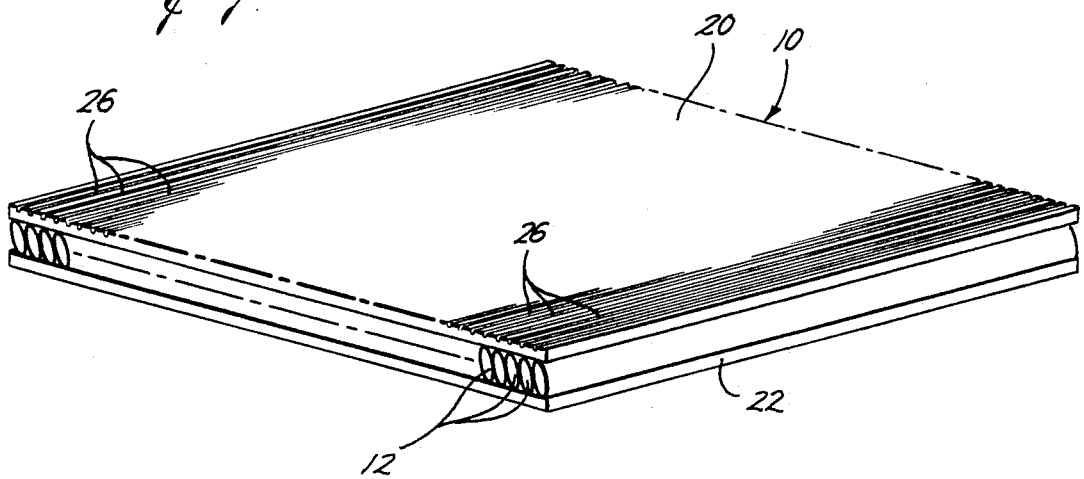
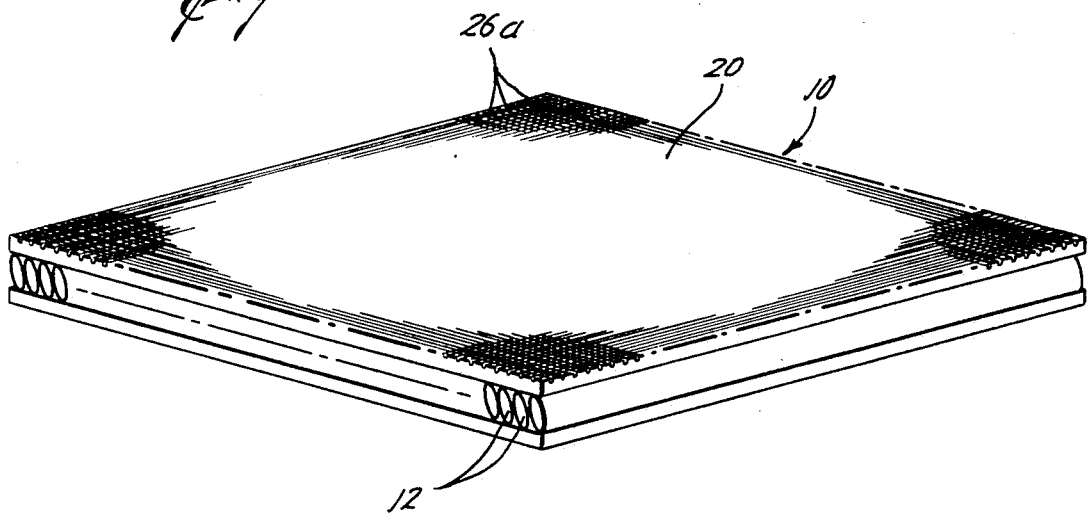

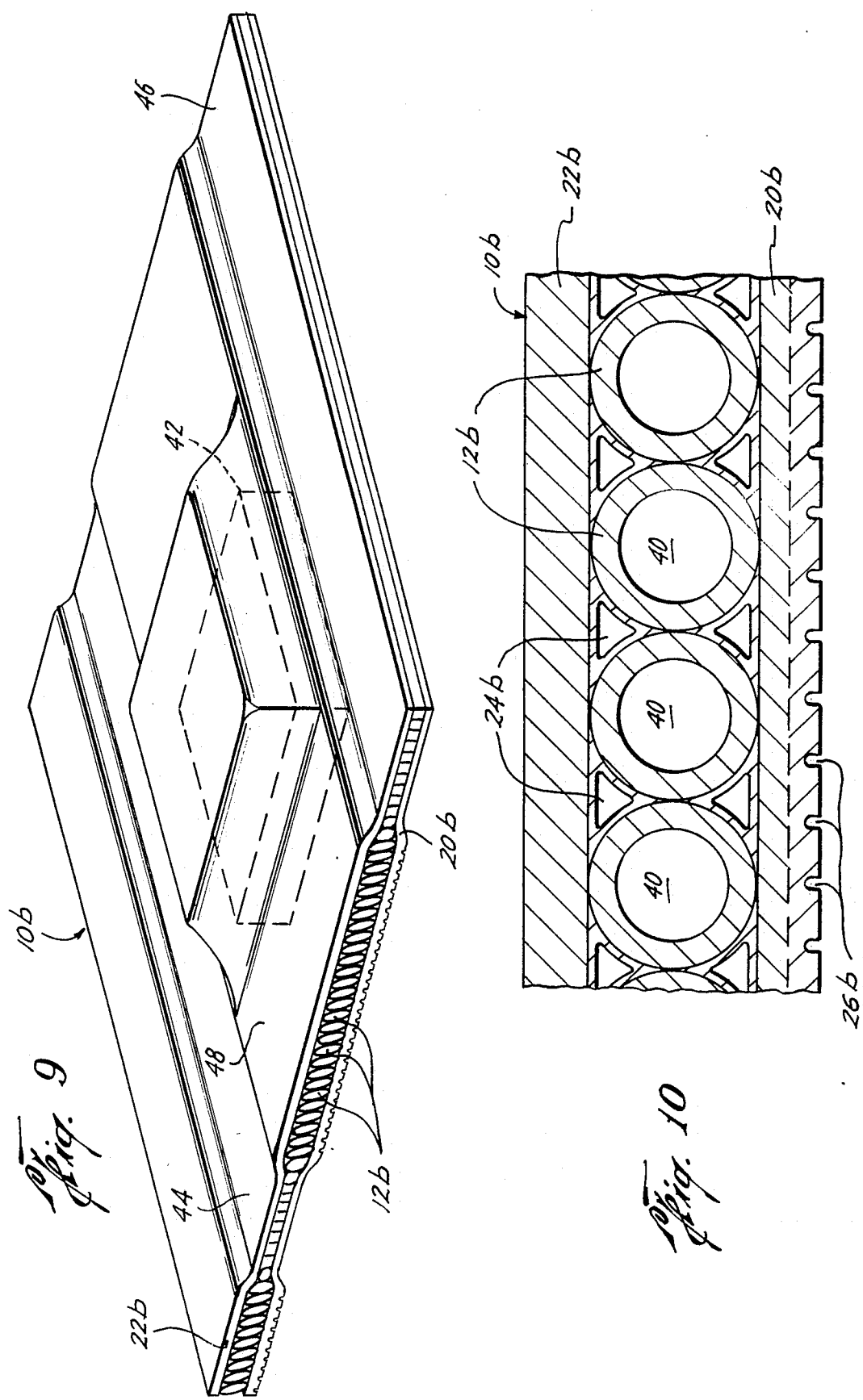

LIQUID RIBBON COOLER

BACKGROUND OF THE INVENTION

It is known to use a water-cooled heat exchanger for cooling electronic components. The present invention is directed to aL improved liquid cooler for use as a high performance heat sink and one which is flexible for mating with and conforming to uneven electronic components.

SUMMARY

The present invention is directed to a liquid ribbon cooler for use with electronic components and includes a plurality of elongate thermo-conductive members having a top, bottom and sides and which are circular in cross-section. The members are positioned side by side. A bottom layer of a thermo-conductive material encloses the bottoms of the elongate members, and a top layer of a thermo-conductive material encloses the tops of the elongate members. Therefore, the bottom layer, top layer and elongate members form a plurality of liquid coolant passageways between the top layer, bottom layer and the exterior of the elongate members.

Still a further object of the present invention is wherein the elongate members are solid cylinders in cross-section, such as wires for providing an inexpensive structure.

Still a further object of the present invention is wherein the elongate members are tubes thereby providing additional liquid coolant passageways within the tubes, if desired.

Still a further object of the present invention is wherein the bottom layer includes an outer layer of molybdenum in which a plurality of microcapillaries are provided for increasing the surface area and thermocoupling of the bottom layer to an electronic component.

A still further object of the present invention is wherein the microcapillaries provide adhesion between the bottom layer and the article to be cooled.

A still further object of the present invention is wherein the microcapillaries allow for detachment between the bottom layer and the article to be cooled.

Still a further object of the present invention is wherein the top and bottom layers are bonded to the elongate members for increasing the thermal conductivity and, if desired, the elongate members may be bonded to each other.

Other and further objects, features and advantages will be apparent from the following description of preferred embodiments of the invention, given for the purpose of disclosure, and taken in conjunction with the accompanying drawings.

BRIEF DESCRIPTION OF THE DRAWINGS

FIG. 1 is an isometric view of one form of the liquid cooler of the present invention, FIG. 2 is an enlarged fragmentary cross-sectional view of the apparatus of FIG. 1, FIG. 3 is an enlarged fragmentary cross-sectional view similar to FIG. 2 of another embodiment of the present invention, FIG. 4 is an enlarged fragmentary cross-sectional view similar to FIG. 2 showing the flexibility of the apparatus in the y- and z- directions.

FIG. 5 is a cross-sectional view taken along the line 5—5 of FIG. 3 showing the flexibility of the present apparatus in the x- and z- directions.

FIG. 6 is a cross-sectional view showing the ribbon cooler of the present invention covering integrated circuit chips of different sizes and different heights, FIG. 7 is a bottom isometric view of FIG. 1 showing one type of microcapillary pattern, FIG. 8 is a view similar to FIG. 7 showing an alternate pattern of microcapillaries on the bottom of the cooler, FIG. 9 is an isometric view of another embodiment of the present invention for providing preferential flow through specific areas, and FIG. 10 is an enlarged fragmentary cross-sectional view of a portion of the embodiment of FIG. 9 incorporating tubular members for added cooling.

DESCRIPTION OF THE PREFERRED EMBODIMENTS

Referring now to the drawings and particularly to FIGS. 1 and 2, the liquid cooler of the present invention is generally indicated by the reference numeral 10 and is useful for cooling electronic components, such as integrated circuit chips. The apparatus 10 includes a plurality of elongate thermoconductive members 12 having a top 14, bottom 16, and sides 18. Elongate members 12 are generally circular in cross-section and are closely positioned side by side with the side 18 of one member 12 being positioned adjacent the side 18 of another member 12.

A bottom layer 20 of a thermo-conductive material encloses and is bonded to the bottoms 16 of the elongate members 12. A top layer 22 of a thermo-conductive material encloses and is bonded to the tops 14 of the elongate members 12. Thus, the bottom layer 20, the top layer 22 and the elongate members 12 form a plurality of liquid coolant passageways 24. The layers 20 and 22 may be part of an enclosure for the members 12.

Preferably, the bottom layer 20 includes a plurality of microcapillaries 26 to be positioned against the article to be cooled. By way of example, the microcapillaries 26 may have a depth of 1 mil, a width of 0.1 mil, and a pitch of 0.5 mil. The microcapillaries 26 increase the surface area of bottom layer 20, resulting in improved thermocoupling between the bottom layer 20 and the article to be cooled.

Further, the microcapillaries 26 can provide sufficient adhesion between the bottom layer 20 and the article to be cooled so that external force-providers, such as springs, are unnecessary. The absence of external force-providers allows for a thinner combination of the liquid cooler 10 and the article to be cooled. This thinner combination may be highly desirable for certain applications, for instance, with high speed computers where decreasing the distance between circuits becomes critical. Another advantage of using adhesive force from the microcapillaries 26 instead of external force-providers is that the adhesive force is likely to be smaller, resulting in less stress upon the article to be cooled and therefore greater reliability.

Providing adhesive force between the microcapillaries 26 and the article to be cooled, however, requires that the microcapillaries 26 be partially filled with a suitable liquid, such as silicone oil, or a suitable liquid metal, such as mercury or liquid gallium alloys.

The microcapillaries 26 allow the liquid cooler 10 to be intimately connected to the article to be cooled, yet also permit the liquid cooler 10 to be easily detached if so desired. Additionally, the microcapillaries 26 provide the ribbon cooler 10 with sufficient flexibility to accommodate articles to be cooled with a wide range of thermal expansion properties.

The advantageous properties of microcapillaries is documented; see, for example, D. B. Tuckerman, "Heat-Transfer Micro-Structures for Integrated Circuits", Stanford University Ph.D. Thesis, NTIS Publication No. UCRL-53515, February, 1984.

The elongate members 12, the bottom layer 20 and the top layer 22 may be made of any suitable conductive material such as copper. If the material is copper, it is advantageous to provide a layer 28 of molybdenum to the $ bottom layer. The layer of molybdenum is particularly advantageous in forming the microcapillaries 26 by etching. Prefered etching techniques include reactive ion etch (RIE) and reactive ion beam etch (RIBE). The elongate members 12 may be formed inexpensively by being formed from lengths of copper wire. As previously indicated, it is desirable that the cooler 10 be flexible for being placed in intimate contact with unevenly shaped electrical components. By way of example only, the thickness of the cooler 10 may be 15 mils. in which the members 12 are copper wires having a diameter of 12 mils. and each of the bottom layer 20 and top layer 22 is approximately ⅜ths of a mil.

The cooling fluid used may be any suitable liquid coolant, such as water. An inlet manifold (not shown) would be placed along a first end 30 and an outlet manifold 31 having an outlet 33 would be placed along the outlet end 32 of the apparatus 10 for directing the liquid coolant through the apparatus 10.

The bottom layer 20 and the top layer 22 are connected to the bottoms 16 and the tops 14, respectively, of the elongate members 12. For example, silver plating 34 may be provided between the bottom layer 20 and the bottoms 16 and also between the top layer 22 and the tops 14 of the members 12. The plated article is then heated in an oven and the copper and silver forms eutectic braze corrosion resistant layers 34. The layers 34 (1) increase the thermal conductivity between the bottom layer 20 and top layer 22 and the member 12; (2) keep the layers 20 and 22 in contact with the members 12 when liquid pressure is applied in passageways 24; and (3) prevent the liquid pressure from changing the size and shape of the passageways 24. The layers 34 may also enclose and protect the liquid coolant passageways 24 from corrosion and the passageways 24 are positioned adjacent elongate members 12 in a heat exchange relationship. However, such layers 34 do adversely effect the flexibility of the cooler 10 to some extent.

Referring now to FIG. 3, another embodiment of the present invention is seen wherein like numbers to those in FIGS. 1 and 2 include the suffix "a". In this case, a corrosion resistant layer 36 is formed between adjacent sides 18a of the elongate members 12a for forming a heat exchange layer and directing the liquid coolant passageways 24a. It is to be noted that layer 36a is also bonded between the tops 14a and the top layer 22a, and between the bottoms 16a and the bottom layer 20a. Therefore, cooler 10a has less flexibility than the cooler 10.

Referring now to FIGS. 1 and 4, it is seen that the structure of the liquid cooler 10 has the ability to flex principally along the y- direction, thereby resulting in a displacement in the z- direction.

Referring now to FIGS. 1 and 5, it is seen that the structure of the liquid cooler 10 also has the ability to bend along the x- direction, thereby resulting in a displacement in the z- direction. However, the liquid cooler 10 is stiffer in the x- direction than in the y-direction.

Referring now to FIG. 6, the liquid ribbon cooler 10 of the present invention is shown in cross-section covering integrated circuit chips 38 and 40, of different size and different heights to illustrate the natural flexibility of the cooler 10. In addition, because of its ability to cover, remain flexible, and be in contact with temperature coefficients of expansion from the chips 38 and 40.

Referring now to FIG. 7, it is to be noted that the microcapillaries 26 extend across the bottom 20 of the liquid cooler 10 in line-like patterns. Of course, other types of capillary patterns may be used and as best seen in FIG. 8, a waffle-type capillary pattern 26a is shown connected to the bottom 20 of the liquid cooler 10.

Referring now to FIGS. 9 and 10, another embodiment of the present invention is shown wherein like character references to like parts in FIGS. 1-3 have been simlarly numbered, but with the addition of the suffix "b". In this embodiment, the elongate members 12b are tubularly shaped in cross-section thereby forming an additional liquid coolant passageways 40 in addition to the liquid coolant passageways 24b. Referring to FIG. 9, the liquid ribbon cooler 10b is positioned over electronic component 42 shown in dotted outline. The embodiment of FIGS. 9 and 10 allows the cooler 10b to be crimped together at locations 44 and 46 on opposite sides of the electronic component 42. The crimping 44 and 46 reduces the flow of liquid coolant through the crimped portions 44 and 46 and instead directs more liquid coolant through the portion 48 which covers and cools the electronic components 42.

The present invention, therefore, is well adapted to carry out the objects and attain the ends and advantages mentioned as well as others inherent therein. While presently preferred embodiments of the invention have been given for the purpose of disclosure, numerous changes in the details of construction will be readily apparent to those skilled in the art and which are encompassed within the spirit of the invention and the scope of the appended claims.

What is claimed is:

1. A liquid ribbon cooler for use with electronic components comprising, a plurality of elongate thermo-conductive members having a top, bottom and sides and which are generally circular in cross-section and which are positioned side by side, a bottom layer of a thermo-conductive material bonded to the bottoms of the elongate members, a top layer of a thermo-conductive material bonded to the tops of the elongate members, said bottom layer, top layer and elongate members forming a plurality of liquid coolant passageways, and said elongate members are tubes.

2. A liquid ribbon cooler for use with electronic components comprising, a plurality of elongate thermo-conductive members having a top, bottom and sides and which are generally circular in cross-section and which are positioned side by side, a bottom layer of a thermo-conductive material bonded to the bottoms of the elongate members, a top layer of a thermo-conductive material bonded to the tops of the elongate members, said bottom layer, top layer and elongate members forming a plurality of liquid coolant passageways, and said adjacent elongate members are bonded together.

3. A liquid ribbon cooler for use with electronic components comprising, a plurality of elongate thermo-conductive members having a top, bottom and sides and which are generally circular in cross-section and which are positioned side by side, a bottom layer of a thermo-conductive material bonded to the bottoms of the elongate members, a top layer of a thermo-conductive material bonded to the tops of the elongate members, said bottom layer, top layer and elongate members forming a plurality of liquid coolant passageways, and wherein the ribbon cooler is flexible so as to readily conform to curved or uneven surfaces of the component or components to be cooled.

4. A liquid ribbon cooler for use with electronic components comprising, a plurality of elongate thermo-conductive members having a top, bottom and sides and which are generally circular in cross-section and which are positioned side by side, a bottom layer of a thermo-conductive material bonded to the bottoms of the elongate members, a top layer of a thermo-conductive material bonded to the tops of the elongate members, said bottom layer, top layer and elongate members forming a plurality of liquid coolant passageways, and wherein the bottom layer includes a plurality of microcapillaries for increasing the surface area and thermocoupling of the bottom layer to an article to be cooled.

5. The apparatus of claim 4 including a layer of molybdenum at the bottom of the bottom layer in which the microcapillaries are provided.

6. The apparatus of claim 4 wherein the microcapillaries are partially filled with a suitable liquid in order to provide adhesion between the ribbon cooler and the article to be cooled.

7. The apparatus of claim 6 wherein the microcapillaries allow for detachment between the ribbon cooler and the article to be cooled.

8. The apparatus of claim 4 wherein the microcapillaries remain intimately attached to the articles to be cooled despite said articles having different thermal expansion properties.

9. A liquid ribbon cooler for use with electronic components comprising, a plurality of elongate thermo-conductive members having a top, bottom and sides and which are generally circular in cross-section and which are positioned side by side, a bottom layer of a thermo-conductive material bonded to the bottoms of the elongate members, a top layer of a thermo-conductive material bonded to the tops of the elongate members, said bottom layer, top layer and elongate members forming a plurality of liquid coolant passageways, and wherein portions of the ribbon cooler in which said plurality of liquid coolant passageways are formed are crimped together for preferentially conveying cooling liquid to passageways in uncrimped portions of the ribbon cooler.

* * * * *